(12) United States Patent
Miyagi

(10) Patent No.: US 6,859,040 B2
(45) Date of Patent: Feb. 22, 2005

(54) VOLTAGE DETECTING CIRCUIT

(75) Inventor: Masanori Miyagi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 129 days.

(21) Appl. No.: 10/245,517

(22) Filed: Sep. 17, 2002

(65) Prior Publication Data

US 2003/0067304 A1 Apr. 10, 2003

(30) Foreign Application Priority Data

Oct. 5, 2001 (JP) ........................................ 2001-310085

(51) Int. Cl.[7] ............................................. G01R 31/08
(52) U.S. Cl. ........................ 324/522; 324/133; 324/433
(58) Field of Search ................................ 324/133, 433, 324/522

(56) References Cited

U.S. PATENT DOCUMENTS

| | | | | |
|---|---|---|---|---|
| 4,812,680 A | * | 3/1989 | Kawashima et al. | 327/97 |
| 5,159,260 A | * | 10/1992 | Yoh et al. | 323/313 |
| 6,351,109 B1 | * | 2/2002 | Yoshida | 323/284 |
| 6,404,239 B1 | * | 6/2002 | Kawahara et al. | 326/121 |
| 6,456,090 B1 | * | 9/2002 | Ishikawa et al. | 324/546 |
| 6,489,786 B1 | * | 12/2002 | Takemoto et al. | 324/713 |
| 6,566,928 B1 | * | 5/2003 | Miyagi | 327/217 |
| 2001/0024064 A1 | * | 9/2001 | Masaoka | 307/10.8 |
| 2003/0094954 A1 | * | 5/2003 | Mashiko | 324/522 |

FOREIGN PATENT DOCUMENTS

JP    354015782 A    *  2/1979    ........... G01B/19/16

* cited by examiner

*Primary Examiner*—Charles H Nolan, Jr.
(74) *Attorney, Agent, or Firm*—Adams & Wilks

(57) ABSTRACT

There is provided a voltage detecting circuit in which a consumed electric current is small, accuracy is high, and an erroneous operation seldom occurs. In the voltage detecting circuit constituted by a bias circuit, a current mirror circuit, a load MIS transistor connected to the current mirror circuit in which current drive capability is changed by an output voltage of the bias circuit, and an amplifying inverter circuit, a potential change at an output node of the current mirror circuit at the time of detection and release of a power supply voltage is steeply changed, so that a leak current of the whole circuit can be decreased and a consumed electric current can be reduced. Besides, plural load P type MIS transistors of the bias circuit are prepared, so that a detection voltage and a release voltage can be made to have hysteresis, abnormal oscillation of a detection output VDETX in the vicinity of the detection and release voltage can be prevented, and an erroneous operation of a logic circuit to which the detection output is applied can be prevented.

8 Claims, 5 Drawing Sheets

VOLTAGE DETECTING CIRCUIT

BACKGROUND OF THE INVENTION

1. Field of the Invention

The present invention relates to a power supply voltage detecting circuit constituted by MIS transistors.

2. Description of the Related Art

Up to now, in the case where a power supply voltage supplied in a semiconductor integrated circuit is low and a circuit operation is apt to become unstable, a circuit has been reset at the time of a low power supply voltage by using a power supply voltage detecting circuit as shown in FIG. 10.

Hereinafter, the circuit will be described on the basis of the drawings.

An N-type depletion MIS transistor 2003 in which a gate electrode and a source electrode are connected to ground and which operates as a constant current element, is connected to an input side of a current mirror circuit constituted by a P-type enhancement MIS transistor 2001 and a P-type enhancement MIS transistor 2002, and an N-type enhancement MIS transistor 2004 is connected to an output side node N3 of the current mirror circuit.

Besides, the circuit includes an N-type enhancement MIS transistor 2008 in which both a drain electrode and a gate electrode are saturation-connected to Vcc, and an N-type depletion MIS transistor 2007 in which a drain electrode is connected to a source electrode of the N-type enhancement MIS transistor 2008, and a gate electrode and a source electrode are connected to ground, and which operates as a constant current element, a connection point N2 between the N-type enhancement MIS transistor 2008 and the N-type depletion MIS transistor 2007 is connected to a gate electrode of the N-type enhancement MIS transistor 2004, and a change in potential at the connection point N2 is amplified and appears at the node N3.

The N-type enhancement MIS transistor 2008 and the N-type depletion MIS transistor 2007 constitute a bias circuit 2009, a potential at the node N3 is further amplified by an inverter constituted by a P-type enhancement MIS transistor 2005 and an N-type enhancement MIS transistor, its waveform is shaped, and it is outputted as VDETX as a detection output of the power supply voltage.

FIGS. 11A and 11B show potential changes at respective nodes N1, N2 and N3 with respect to a change of the power supply voltage, and although the node N3 outputs a potential almost equal to the power supply voltage in a detection state of a low voltage, in the state where the low voltage is released, an output is not accurately lowered to the grand level, and as the power supply voltage becomes high, it gradually approaches the ground level.

This is because immediately after detection release of the potential at the node N2, the gate electrode of the N-type enhancement MIS transistor 2004 can not be sufficiently biased, and the current drive capability of the N-type enhancement MIS transistor 2004 can not sufficiently overcome the current supply capability of the current mirror circuit.

Since the potential at the node N3 is changed in this way, the N-type enhancement MIS transistor 2006 constituting the inverter to which the potential of the node N3 is inputted can not be completely turned off in the detection release state, a leak current is generated, resulting in an increase in a consumed electric current.

SUMMARY OF THE INVENTION

In order to achieve the above-mentioned object, according to a first aspect of the invention, there is provided a voltage detecting circuit including: a current mirror circuit having at least one input terminal and at least one output terminal; a first constant current circuit with an output terminal connected to the input terminal of the current mirror circuit; a first conductivity type enhancement MIS transistor having a gate electrode, a drain electrode, and a source electrode, the drain electrode being connected to the output terminal of the current mirror circuit, and the source electrode being connected to a first power supply potential; a second constant current circuit with an output terminal connected to the gate electrode of the first conductivity type MIS transistor; a second conductivity type enhancement MIS transistor including a gate electrode, a drain electrode, and a source electrode, the drain electrode being connected to the output terminal of the second constant current circuit, the source electrode being connected to a second power supply potential, and the gate electrode being connected to the first power supply potential; an amplifying circuit including at least one input terminal and at least one output terminal, the input terminal being connected to the output terminal of the current mirror circuit, and the output terminal being a terminal for outputting a voltage detection output of the power supply potential. Thus, it becomes possible to reduce a leak current of the circuit to thereby lower a consumed electric current.

According to a second aspect of the present invention, in the first aspect of the invention, there is provided a voltage detecting circuit in which the current mirror circuit includes a second conductivity type first MIS transistor and a second conductivity type second MIS transistor, a source electrode of the second conductivity type first MIS transistor is connected to the second power supply potential, a gate electrode and a drain electrode are connected in common and are connected to an input terminal of the current mirror circuit, a source electrode of the second conductivity type second MIS transistor is connected to the second power supply potential, a drain electrode is connected to the output terminal of the current mirror circuit, a gate electrode is connected to the gate electrode and the drain electrode of the second conductivity type first MIS transistor, the first constant current circuit includes a first conductivity type depletion MIS transistor, source electrode and a gate electrode of the first conductivity type depletion MIS transistor constituting the first constant current circuit is connected to the first power supply potential, a drain electrode is connected to the output terminal of the first constant current circuit, the second constant current circuit includes a first conductivity type depletion MIS transistor, a source electrode and a gate electrode of the first conductivity type depletion MIS transistor constituting the second constant current circuit are connected to the first power supply potential, a drain electrode is connected to the output terminal of the second constant current circuit, and the amplifying circuit is an inverter circuit including a first conductivity type enhancement MIS transistor and a second conductivity type enhancement MIS transistor. Thus, it becomes possible to reduce a leak current of the circuit to thereby lower a consumed electric current.

According to a third aspect of the present invention, in the second aspect of the invention, there is provided a voltage detecting circuit, in which both an absolute value of the threshold voltage of the second conductivity type enhancement MIS transistor connected to the second constant current circuit is higher than absolute values of threshold voltages of the second conductivity type enhancement MIS transistors constituting the current mirror circuit and the amplifying circuit. Thus, it becomes possible to reduce a leak current of the circuit to thereby lower a consumed electric current.

According to a fourth aspect of the present invention, there is provided a voltage detecting circuit including: a current mirror circuit having at least one input terminal and at least one output terminal; a first constant current circuit with an output terminal connected to the input terminal of the current mirror circuit; a first conductivity type enhancement MIS transistor having a gate electrode, a drain electrode, and a source electrode, the drain electrode being connected to the output terminal of the current mirror circuit, and the source electrode being connected to a first power supply potential; a second constant current circuit with an output terminal connected to the gate electrode of the first conductivity type MIS transistor; a second conductivity type enhancement MIS transistor having a first threshold voltage and including a gate electrode, a drain electrode, and a source electrode, the drain electrode being connected to the output terminal of the second constant current circuit, the source electrode being connected to a second power supply potential, and the gate electrode being connected to the first power supply potential; a second conductivity type enhancement MIS transistor having a second threshold voltage and including a gate electrode, a drain electrode, and a source electrode, the drain electrode being connected to the output terminal of the second constant current circuit, and the source electrode being connected to the second power supply potential; an inverter circuit including an output terminal and an input terminal, the output terminal being connected to the gate electrode of the second conductivity type enhancement MIS transistor having the second threshold voltage; and an amplifying circuit including at least one input terminal and at least one output terminal, the input terminal being connected to the output terminal of the current mirror circuit, the output terminal being connected to an input of the inverter circuit, and the output terminal being a terminal for outputting a voltage detection output of the power supply potential. Thus, it becomes possible to reduce a leak current of the circuit to thereby lower a consumed electric current.

According to a fifth aspect of the present invention, in the fourth aspect of the invention, there is provided a voltage detecting circuit, in which the current mirror circuit includes a second conductivity type first MIS transistor and a second conductivity type second MIS transistor, a source electrode of the second conductivity type first MIS transistor is connected to the second power supply potential, a gate electrode and a drain electrode are connected in common and are connected to an input terminal of the current mirror circuit, a source electrode of the second conductivity type second MIS transistor is connected to the second power supply potential, a drain electrode is connected to the output terminal of the current mirror circuit, a gate electrode is connected to the gate electrode and the drain electrode of the second conductivity type first MIS transistor, the first constant current circuit includes a first conductivity type depletion MIS transistor, a source electrode and a gate electrode of the first conductivity type depletion MIS transistor constituting the first constant current circuit is connected to the first power supply potential, a drain electrode is connected to the output terminal of the first constant current circuit, the second constant current circuit includes a first conductivity type depletion MIS transistor, a source electrode and a gate electrode of the first conductivity type depletion MIS transistor constituting the second constant current circuit are connected to the first power supply potential, a drain electrode is connected to the output terminal of the second constant current circuit, and the amplifying circuit is an inverter circuit including a first conductivity type enhancement MIS transistor and a second conductivity type enhancement MIS transistor. Thus, it becomes possible to reduce a leak current of the circuit to thereby lower a consumed electric current.

According to a sixth aspect of the present invention, in the fifth aspect of the invention, there is provided a voltage detecting circuit, in which both an absolute value of the threshold voltage of the second conductivity type enhancement MIS transistor having the first threshold voltage and connected to the second constant circuit and an absolute value of the threshold voltage of the second conductivity type enhancement MIS transistor having the second threshold voltage are higher than absolute values of threshold voltages of the second conductivity type enhancement MIS transistors constituting the current mirror circuit and the amplifying circuit, and the absolute value of the threshold voltage of the second conductivity type enhancement MIS transistor having the first threshold voltage is higher than the absolute value of the threshold voltage of the second conductivity type enhancement MIS transistor having the second threshold voltage. Thus, it becomes possible to reduce a leak current of the circuit to thereby lower a consumed electric current.

According to a seventh aspect of the present invention, there is provided a voltage detecting circuit including: a current mirror circuit having at least one input terminal and at least one output terminal; a first constant current circuit with an output terminal connected to the input terminal of the current mirror circuit; a first conductivity type enhancement MIS transistor having a gate electrode, a drain electrode, and a source electrode, the drain electrode being connected to the output terminal of the current mirror circuit, and the source electrode being connected to a first power supply potential; a second constant current circuit with an output terminal connected to the gate electrode of the first conductivity type MIS transistor; a second conductivity type enhancement MIS transistor having a first current drive capability and including a gate electrode, a drain electrode, and a source electrode, the drain electrode being connected to the output terminal of the second constant current circuit, the source electrode being connected to a second power supply potential, and the gate electrode being connected to the first power supply potential; a second conductivity type enhancement MIS transistor having a second current drive capability and including a gate electrode, a drain electrode, and a source electrode, the drain electrode being connected to the output terminal of the second constant current circuit, and the source electrode being connected to the second power supply potential; an inverter circuit including an output terminal and an input terminal, the output terminal being connected to the gate electrode of the second conductivity type enhancement MIS transistor having the second current drive capability; and an amplifying circuit including at least one input terminal and at least one output terminal, the input terminal being connected to the output terminal of the current mirror circuit, the output terminal being connected to an input of the inverter circuit, and the output terminal being a terminal for outputting a voltage detection output of the power supply potential, in which a threshold voltage of the second conductivity type enhancement MIS transistor having the first current drive capability is equal to a threshold voltage of the second conductivity type MIS transistor having the second current drive capability. Thus, it becomes possible to reduce a leak current of the circuit to thereby lower a consumed electric current.

According to an eighth aspect of the present invention, in the seventh aspect of the invention, there is provided a voltage detecting circuit, in which the current mirror circuit includes a second conductivity type first MIS transistor and a second conductivity type second MIS transistor, a source electrode of the second conductivity type first MIS transistor is connected to the second power supply potential, a gate electrode and a drain electrode are connected in common and are connected to an input terminal of the current mirror circuit, a source electrode of the second conductivity type second MIS transistor is connected to the second power supply potential, a drain electrode is connected to the output terminal of the current mirror circuit, a gate electrode is connected to the gate electrode and the drain electrode of the second conductivity type first MIS transistor, the first constant current circuit includes a first conductivity type depletion MIS transistor, source electrode and a gate electrode of the first conductivity type depletion MIS transistor constituting the first constant current circuit is connected to the first power supply potential, a drain electrode is connected to the output terminal of the first constant current circuit, the second constant current circuit includes a first conductivity type depletion MIS transistor, a source electrode and a gate electrode of the first conductivity type depletion MIS transistor constituting the second constant current circuit are connected to the first power supply potential, a drain electrode is connected to the output terminal of the second constant current circuit, and the amplifying circuit is an inverter circuit including a first conductivity type enhancement MIS transistor and a second conductivity type enhancement MIS transistor. Thus, it becomes possible to reduce a leak current of the circuit to thereby lower a consumed electric current.

DETAILED DESCRIPTION OF THE PREFERRED EMBODIMENTS

Hereinafter, Embodiments 1 to 7 of a voltage detecting circuit of the present invention will be described in detail with reference to the drawings.

(Embodiment 1)

Figure 1:
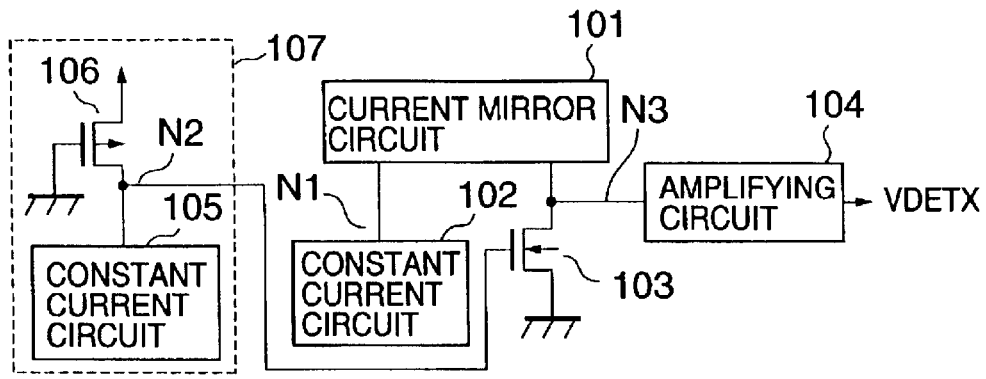
FIG. 1 is a block diagram showing a structure of a voltage detecting circuit according to Embodiment 1 of the present invention.

FIG. 1 is a block diagram showing a structure of a voltage detecting circuit according to Embodiment 1 of the invention.

In the present invention, a first constant current circuit 102 is connected to an input side N1 of a current mirror circuit 101, an N-type enhancement MIS transistor 103 is connected to an output side N3, an amplifying circuit 104 is connected to the output side N3 of the current mirror circuit, and the amplifying circuit outputs a detection output VDETX.

A gate of the N-type enhancement MIS transistor 103 is biased at a connection point N2 between a second constant current circuit 105 and a drain of a P-type enhancement MIS transistor 106. The second constant current circuit 105 and the P-type enhancement MIS transistor 106 constitute a bias circuit 107.

Since a gate of the P-type enhancement MIS transistor 106 is connected to ground as a first power supply potential, and its source is connected to Vcc as a second power supply voltage, a gate source voltage Vgs is designed such that a maximum bias is always applied.

Figure 4A:
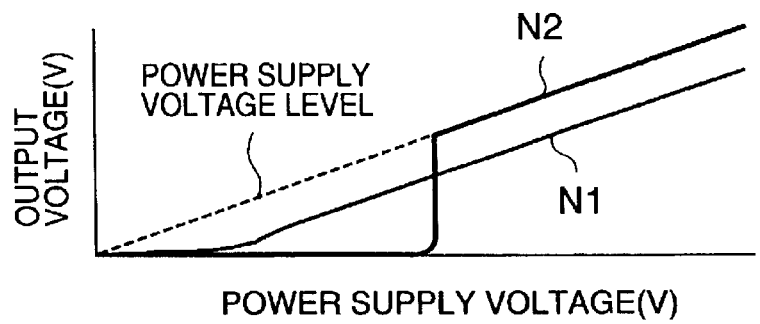
FIGS. 4A and 4B are graphs showing potential changes at respective nodes when power supply voltage is changed in the voltage detecting circuits of Embodiments 1 to 3 of the present invention.
Figure 4B:
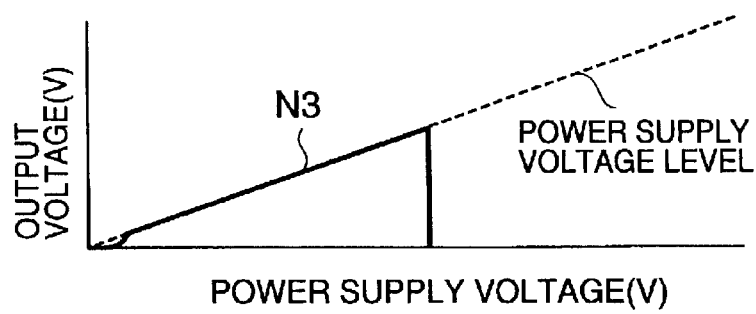

With this structure, at the instant when power supply voltage exceeds a threshold voltage of the P-type enhancement MIS transistor 106, the potential at the node N2 is suddenly changed from the ground level to the power supply voltage level, the gate source voltage of the N-type enhancement MIS transistor 103 is also steeply changed, and its gate is sufficiently biased, so that the potential at the node N3 is steeply lowered from the level of the power supply voltage to the ground level. FIG. 4 shows potential changes at the nodes N1, N2 and N3 at this time.

With this structure, it is possible to prevent an intermediate potential between Vcc and the ground from being applied to the input of the amplifying circuit 104 and to prevent a leak current in the amplifying circuit.

Besides, although the detection voltage of the power supply voltage has a value close to the threshold voltage of the P-type enhancement MIS transistor 106, the detection voltage can be adjusted by suitably adjusting the ratio of the current drive capability of the P-type enhancement MIS transistor 106 to the current drive capability of the constant current circuit.

(Embodiment 2)

Figure 2:
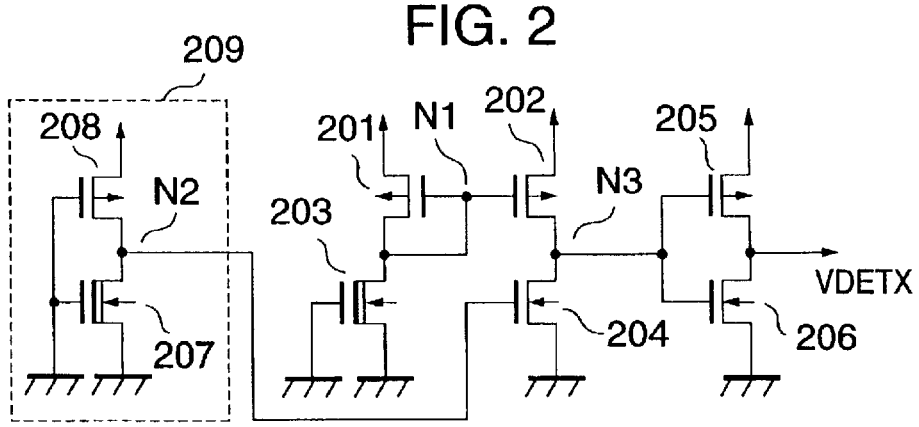
FIG. 2 is a circuit diagram showing a structure of a voltage detecting circuit according to Embodiment 2 of the present invention.

FIG. 2 is a circuit diagram showing a structure of a voltage detecting circuit according to Embodiment 2 of the present invention. In the figure, there is shown an example of a detailed structure of the current mirror circuit, the amplifying circuit and the constant current circuit of Embodiment 1.

A current mirror circuit is constituted by P-type enhancement MIS transistors 201 and 202 in which gates are connected in common, and the gate and drain of the P-type enhancement MIS transistor 201 are connected in common and serve as an input terminal N1 of the current mirror circuit.

A drain of the P-type enhancement MIS transistor 202 serves as an output terminal N3 of the current mirror circuit.

A P-type enhancement MIS transistor 208 and an N-type depletion MIS transistor 207 constitute a bias circuit 209.

Both the N-type depletion MIS transistors 203 and 207 operate as constant current elements in each of which a gate electrode and a source electrode are connected to ground. A part corresponding to the amplifying circuit 104 of FIG. 1 is a general CMOS inverter constituted by a P-type enhancement MIS transistor 205 and an N-type enhancement MIS transistor 206.

Since potential changes at the nodes N1, N2 and N3 of Embodiment 2 also show the behavior as shown in FIG. 4, it is possible to prevent an intermediate potential between Vcc and ground from being applied to gate electrodes of the P-type enhancement MIS transistor 205 and the N-type enhancement MIS transistor 206 constituting the amplifying circuit and further to prevent a leak current in the amplifying circuit.

(Embodiment 3)

Figure 3:
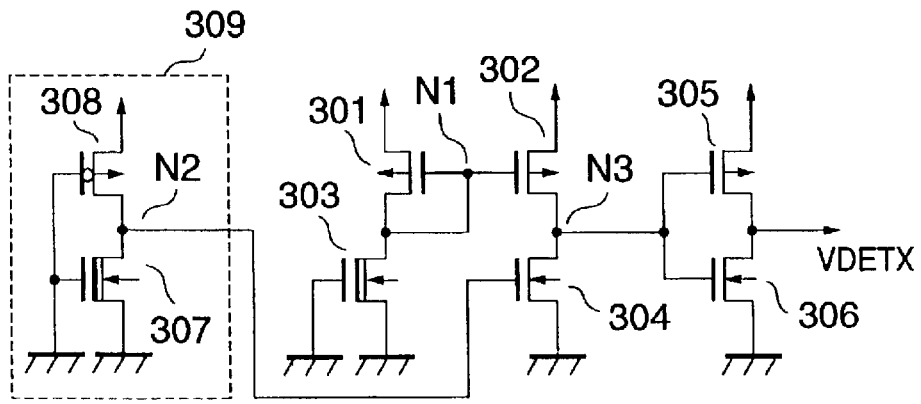
FIG. 3 is a circuit diagram showing a structure of a voltage detecting circuit according to Embodiment 3 of the present invention.

FIG. 3 is a circuit diagram showing a structure of a voltage detecting circuit according to Embodiment 3 of the present invention. In Embodiment 3, in order to obtain a relatively high detection voltage with high precision, a threshold voltage of a P-type enhancement MIS transistor 308 has a value higher than threshold voltages of P-type MIS transistors 301 and 302 constituting a current mirror circuit and a P-type MIS transistor 305 constituting an amplifying inverter. The intensities of the threshold voltages stated here are compared with each other in the absolute value.

A P-type enhancement MIS transistor 308 and an N-type depletion MIS transistor 307 constitute a bias circuit 309.

For example, threshold voltages of the P-type MIS transistors 301, 302 and 305 are made approximately −0.7 V, and that of the P-type MIS transistor 308 is made approximately −1.9 V.

As a result, approximately 1.9 V can be obtained as the detection voltage of the voltage detecting circuit of the present invention, and when a threshold voltage of a P-type MIS transistor constituting a logic circuit to which the detection signal is inputted, is made approximately −0.7 V, it is possible to avoid such a disadvantage in that the detection signal is released at the time of rising of power supply voltage before it reaches a power supply voltage at which the operation of the circuit becomes stable, so that sufficient circuit reset can not be performed.

Besides, the detection voltage can be easily changed by changing a target value of the threshold voltage of the P-type MIS transistor 308. Further, the detection voltage can be adjusted by appropriately setting the size ratio of the P-type enhancement MIS transistor 308 to the N-type depletion MIS transistor 307, to thereby adjust the ratio between their current drive capabilities.

(Embodiment 4)

Figure 5:
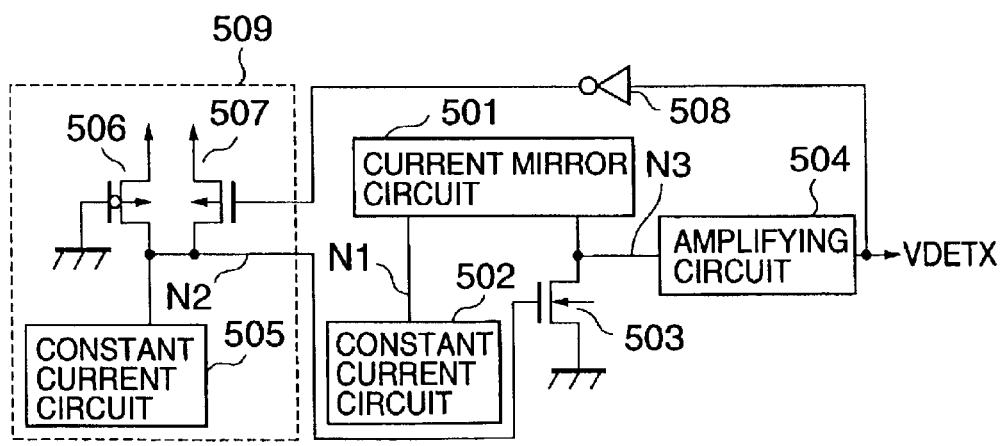
FIG. 5 is a block diagram showing a structure of a voltage detecting circuit according to Embodiment 4 of the present invention.

FIG. 5 is a block diagram showing a structure of a voltage detecting circuit according to Embodiment 4 of the present invention.

The one P-type enhancement MIS transistor connected to the node N2 of Embodiment 1 is changed to two P-type enhancement MIS transistors having different threshold voltages.

A gate electrode of a P-type enhancement MIS transistor 506 is connected to ground similarly to the P-type enhancement MIS transistor 106 of Embodiment 1, and a maximum bias is always applied between its gate/source. A detection output VDETX of a power supply voltage is inverted by an inverter 508 and a feedback signal is applied to a gate electrode of the other P-type enhancement MIS transistor 507. A second constant current circuit 505 and the P-type enhancement MIS transistors 506 and 507 constitute a bias circuit 509.

Here, a threshold voltage of the P-type enhancement MIS transistor 506 is made higher than a threshold voltage of the P-type enhancement MIS transistor 507 in the absolute value. For example, the threshold voltage of the P-type enhancement MIS transistor 506 is made approximately −1.9 V, and the threshold voltage of the P-type enhancement MIS transistor 507 is made approximately −0.7 V.

With this structure, since a release output at the time when the power supply voltage is raised and a detection output at the time when the power supply voltage is lowered, can be made to have hysteresis, inadvertent oscillation of an output in the vicinity of the detection release voltage can be prevented, and therefore, it becomes possible to prevent an erroneous operation of a circuit to which the detection output is applied and to lower a consumed electric current.

Figure 8A:
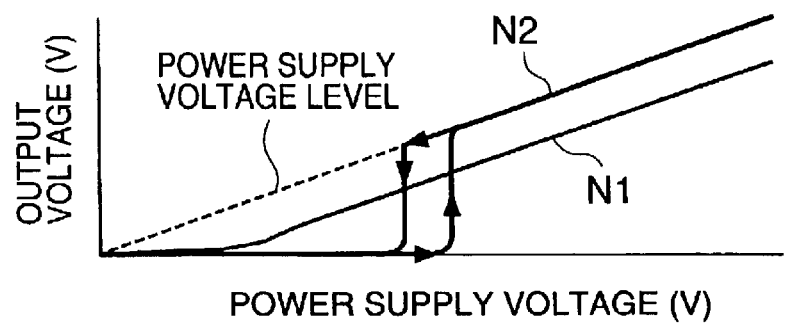
FIGS. 8A and 8B are graphs showing potential changes at respective nodes when power supply voltage is changed in the voltage detecting circuits of Embodiments 4 to 6 and Embodiment 7 of the present invention.
Figure 8B:
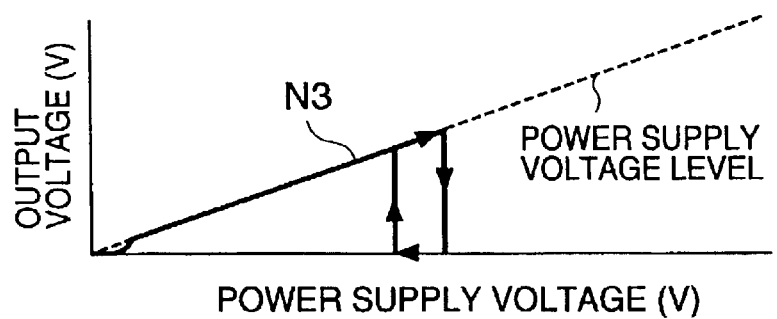

FIG. 8 shows potential changes at the nodes N1, N2 and N3 at this time.

The detection and release voltage can be adjusted by appropriately setting the current drive capability ratio among the P-type enhancement MIS transistor 506, the P-type enhancement MIS transistor 507, and the constant current circuit 505.

(Embodiment 5)

Figure 6:
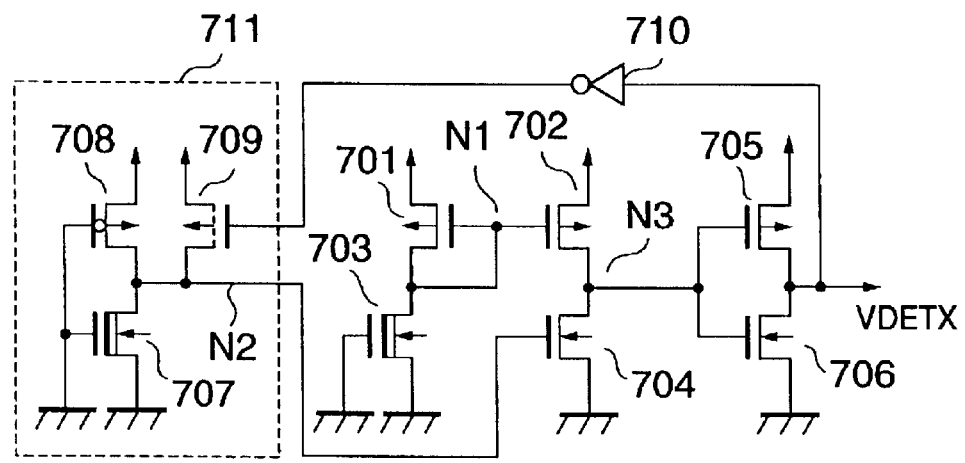
FIG. 6 is a circuit diagram showing a structure of a voltage detecting circuit according to Embodiment 5 of the present invention.

FIG. 6 is a circuit diagram showing a structure of a voltage detecting circuit according to Embodiment 5 of the present invention.

In the figure, there is shown an example of a detailed structure of the current mirror circuit, the amplifying circuit, and the constant current circuit of Embodiment 4.

A current mirror circuit is constituted by P-type enhancement MIS transistors 601 and 602 in which gates are connected in common, and the gate and drain of the P-type enhancement MIS transistor 601 are connected in common and serves as an input terminal N1 of the current mirror circuit.

Besides, a drain of the P-type enhancement MIS transistor 602 becomes an output terminal N3 of the current mirror circuit.

P-type enhancement MIS transistors 608 and 609, and an N-type depletion MIS transistor 607 constitute a bias circuit 611.

Both the N-type depletion MIS transistors 603 and 607 operate as constant current elements in each of which a gate electrode and a source electrode are connected to ground. A part corresponding to the amplifying circuit 504 of FIG. 5 is a general CMOS inverter constituted by a P-type enhancement MIS transistor 605 and an N-type enhancement MIS transistor 606.

Since potential changes at the nodes N1, N2 and N3 in Embodiment 5 also show the behavior as shown in FIG. 8, it is possible to prevent an intermediate potential between Vcc and the ground from being applied to gate electrodes of the P-type enhancement MIS transistor 605 and the N-type enhancement MIS transistor 606 constituting the amplifying circuit and to prevent a leak current in the amplifying circuit.

Besides, by adopting such structure, a release output at the time when the power supply voltage is raised and a detection output at the time when the power supply voltage is lowered are allowed to have hysteresis. As a result, inadvertent oscillation of the output in the vicinity of the detection release voltage can be prevented, and hence, it becomes possible to prevent an erroneous operation of a circuit to which the detection output is applied and to lower a consumed electric current.

(Embodiment 6)

Figure 7:
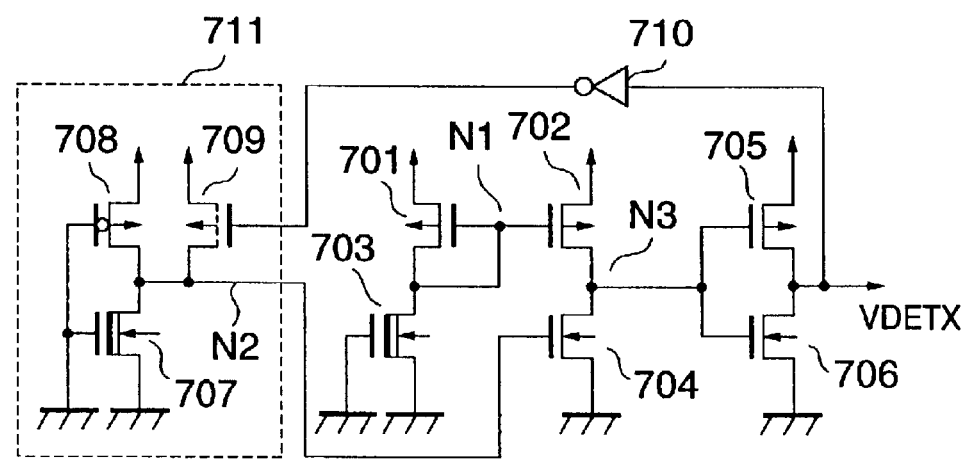
FIG. 7 is a circuit diagram showing a structure of a voltage detecting circuit according to Embodiment 6 of the present invention.

FIG. 7 is a circuit diagram showing a structure of a voltage detecting circuit according to Embodiment 6 of the present invention. A threshold voltage of a P-type enhancement MIS transistor 709 connected to a node N2 is set different from threshold voltages of P-type enhancement MIS transistors 701 and 702 constituting a current mirror circuit and a P-type enhancement MIS transistor 705 constituting an inverter.

A value between a threshold voltage of a P-type enhancement MIS transistor 708 and a threshold voltage of the P-type enhancement MIS transistors 701, 702 and 705 is set such that for example, when the threshold voltage of the P-type enhancement MIS transistor 708 is approximately −1.9 V, and the threshold voltages of the P-type enhancement MIS transistors 701, 702 and 705 are −0.7 V, the threshold voltage of the P-type enhancement MIS transistor 709 is approximately −1.6 V. At this time, the release voltage of the voltage detecting circuit is approximately 1.9 V, and the detection voltage is approximately 1.6 V.

By adopting such structure, the release output at the time when the power supply voltage is raised and the detection output at the time when the power supply voltage is lowered are allowed to have hysteresis. As a result, inadvertent oscillation of the output in the vicinity of the detection release voltage can be prevented, and hence, it becomes possible to prevent an erroneous operation of a circuit to which the detection output is applied and to lower a consumed electric current. Further, since fluctuation of the detection release voltage almost depends on only fluctuation of the threshold voltage, the accuracy is high, and when a threshold voltage of a P-type MIS transistor constituting a logic circuit to which the detection signal is inputted is made approximately −0.7 V, it is possible to avoid such a disadvantage in that the detection signal is released at the time of rising of power supply voltage before it reaches a power supply voltage at which the operation of the circuit becomes stable so that sufficient circuit reset can not be performed. Besides, reset can be performed at the time of decrease of the power supply voltage before the circuit performs an unstable operation.

FIG. 8 similarly shows potential changes at the nodes N1, N2 and N3 at this time.

Besides, the detection voltage can be easily changed by changing target values of the threshold voltages of the P-type MIS transistors 708 and 709. Further, the detection voltage can be adjusted by appropriately setting the size ratio of the P-type enhancement MIS transistors 708 and 709 to the N-type depletion MIS transistor 707, to thereby adjust the ratio between their current drive capabilities.

(Embodiment 7)

Figure 9:
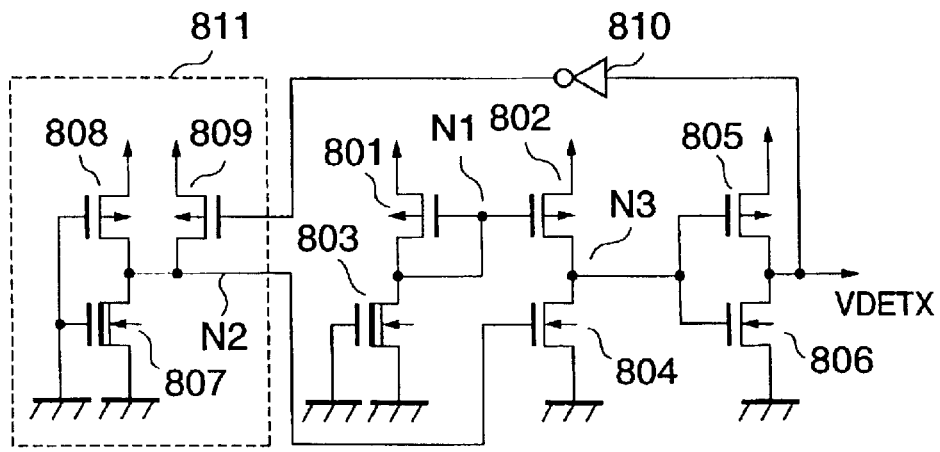
FIG. 9 is a circuit diagram showing a structure of a voltage detecting circuit according to Embodiment 7 of the present invention.
Figure 10:
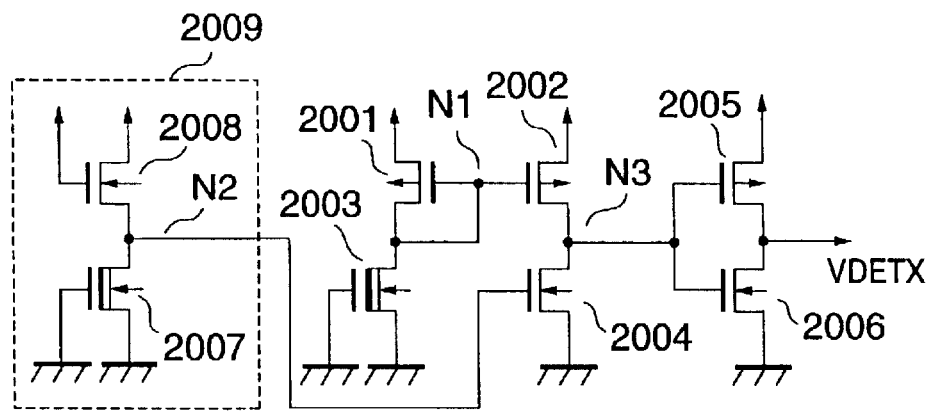
FIG. 10 is a circuit diagram showing a structure of a conventional voltage detecting circuit.
Figure 11A:
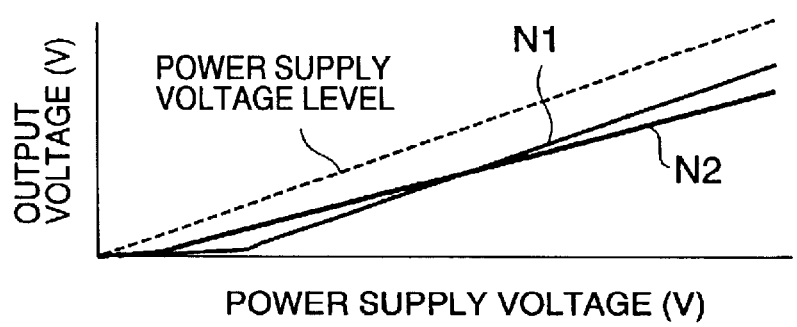
FIGS. 11A and 11B are graphs showing potential changes at respective nodes when power supply voltage is changed in the conventional voltage detecting circuit.
Figure 11B:
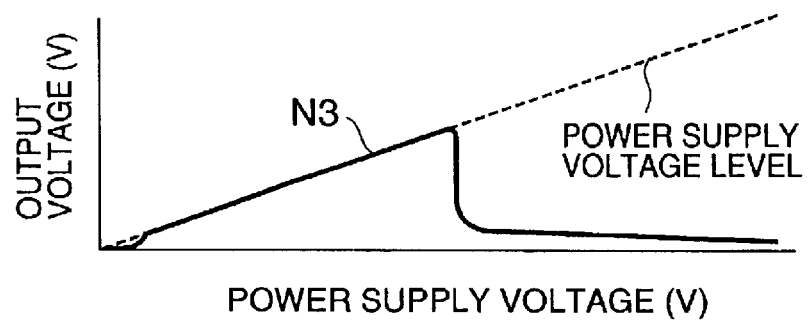

FIG. 9 is a circuit diagram showing a structure of a voltage detecting circuit according to Embodiment 7 of the present invention. Although this invention has a circuit structure similar to that of Embodiment 6, P-type enhancement MIS transistors 808 and 809 are designed to have the same value as a threshold value of P-type enhancement MIS transistors 801 and 802 constituting a current mirror circuit and a P-type enhancement MIS transistor 805 constituting an inverter.

A difference between a detection voltage and a release voltage is formed by appropriately setting the size ratio of the P-type enhancement MIS transistors 808 and 809 to an N-type depletion MIS transistor 807, to thereby adjust the ratio between their current drive capabilities, and hysteresis is provided.

The current drive capability can be easily adjusted by changing the size of channel width or channel length in the transistor size. In order to provide suitable hysteresis, it is necessary to adjust the size so that the current drive capability of the P-type enhancement MIS transistor 809 becomes higher than the current drive capability of the P-type enhancement MIS transistor 808.

By adopting such structure, an introducing step of channel impurities for forming plural threshold voltages can be reduced. As a result, the voltage detecting circuit of the present invention can be constructed at low cost.

As described above, according to this invention, the input of the amplifying circuit as the final stage of the voltage detecting circuit is steeply changed before or after voltage detection, so that it becomes possible to decrease a leak current of the amplifying circuit and to lower a consumed electric current of the whole circuit.

Further, the detection voltage and release voltage are made to have hysteresis, so that it becomes possible to prevent an erroneous operation of a circuit to which the detection output is applied and to lower a consumed electric current.

What is claimed is:

1. A voltage detecting circuit comprising:
   a current mirror circuit having at least one input terminal and at least one output terminal;
   a first constant current circuit with an output terminal connected to the input terminal of the current mirror circuit;
   a first conductivity type enhancement MIS transistor having a gate electrode, a drain electrode, and a source electrode, the drain electrode being connected to the output terminal of the current mirror circuit, and the source electrode being connected to a first power supply potential;
   a second constant current circuit with an output terminal connected to the gate electrode of the first conductivity type MIS transistor;
   a second conductivity type enhancement MIS transistor including a gate electrode, a drain electrode, and a source electrode, the drain electrode being connected to the output terminal of the second constant current circuit, the source electrode being connected to a second power supply potential, and the gate electrode being connected to the first power supply potential;
   an amplifying circuit including at least one input terminal and at least one output terminal, the input terminal being connected to the output terminal of the current mirror circuit, and the output terminal being a terminal for outputting a voltage detection output of the power supply potential.

2. A voltage detecting circuit according to claim 1, wherein
   the current mirror circuit includes a second conductivity type first MIS transistor and a second conductivity type second MIS transistor,
   a source electrode of the second conductivity type first MIS transistor is connected to the second power supply potential, a gate electrode and a drain electrode are connected in common and are connected to an input terminal of the current mirror circuit, a source electrode of the second conductivity type second MIS transistor is connected to the second power supply potential, a drain electrode is connected to the output terminal of the current mirror circuit, a gate electrode is connected to the gate electrode and the drain electrode of the second conductivity type first MIS transistor, the first constant current circuit includes a first conductivity type depletion MIS transistor, source electrode and a gate electrode of the first conductivity type depletion MIS transistor constituting the first constant current circuit is connected to the first power supply potential, a drain electrode is connected to the output terminal of the first constant current circuit, the second constant current circuit includes a first conductivity type depletion MIS transistor, a source electrode and a gate electrode of the first conductivity type depletion MIS transistor constituting the second constant current circuit are connected to the first power supply potential, a drain electrode is connected to the output terminal of the second constant current circuit, and the amplifying circuit is an inverter circuit including a first conductivity type enhancement MIS transistor and a second conductivity type enhancement MIS transistor.

3. A voltage detecting circuit according to claim 2, wherein both an absolute value of the threshold voltage of the second conductivity type enhancement MIS transistor connected to the second constant current circuit is higher than absolute values of threshold voltages of the second conductivity type enhancement MIS transistors constituting the current mirror circuit and the amplifying circuit.

4. A voltage detecting circuit comprising:

a current mirror circuit having at least one input terminal and at least one output terminal;

a first constant current circuit with an output terminal connected to the input terminal of the current mirror circuit;

a first conductivity type enhancement MIS transistor having a gate electrode, a drain electrode, and a source electrode, the drain electrode being connected to the output terminal of the current mirror circuit, and the source electrode being connected to a first power supply potential;

a second constant current circuit with an output terminal connected to the gate electrode of the first conductivity type MIS transistor;

a second conductivity type enhancement MIS transistor having a first threshold voltage and including a gate electrode, a drain electrode, and a source electrode, the drain electrode being connected to the output terminal of the second constant current circuit, the source electrode being connected to a second power supply potential, and the gate electrode being connected to the first power supply potential;

a second conductivity type enhancement MIS transistor having a second threshold voltage and including a gate electrode, a drain electrode, and a source electrode, the drain electrode being connected to the output terminal of the second constant current circuit, and the source electrode being connected to the second power supply potential;

an inverter circuit including an output terminal and an input terminal, the output terminal being connected to the gate electrode of the second conductivity type enhancement MIS transistor having the second threshold voltage; and an amplifying circuit including at least one input terminal and at least one output terminal, the input terminal being connected to the output terminal of the current mirror circuit, the output terminal being connected to an input of the inverter circuit, and the output terminal being a terminal for outputting a voltage detection output of the power supply potential.

5. A voltage detecting circuit according to claim 4, wherein the current mirror circuit includes a second conductivity type first MIS transistor and a second conductivity type second MIS transistor, a source electrode of the second conductivity type first MIS transistor is connected to the second power supply potential, a gate electrode and a drain electrode are connected in common and are connected to an input terminal of the current mirror circuit, a source electrode of the second conductivity type second MIS transistor is connected to the second power supply potential, a drain electrode is connected to the output terminal of the current mirror circuit, a gate electrode is connected to the gate electrode and the drain electrode of the second conductivity type first MIS transistor, the first constant current circuit includes a first conductivity type depletion MIS transistor, source electrode and a gate electrode of the first conductivity type depletion MIS transistor constituting the first constant current circuit is connected to the first power supply potential, a drain electrode is connected to the output terminal of the first constant current circuit, the second constant current circuit includes a first conductivity type depletion MIS transistor, a source electrode and a gate electrode of the first conductivity type depletion MIS transistor constituting the second constant current circuit are connected to the first power supply potential, a drain electrode is connected to the output terminal of the second constant current circuit, and the amplifying circuit is an inverter circuit including a first conductivity type enhancement MIS transistor and a second conductivity type enhancement MIS transistor.

6. A voltage detecting circuit according to claim 5, wherein both an absolute value of the threshold voltage of the second conductivity type enhancement MIS transistor having the first threshold voltage and connected to the second constant current circuit and an absolute value of the threshold voltage of the second conductivity type enhancement MIS transistor having the second threshold voltage are higher than absolute values of threshold voltages of the second conductivity type enhancement MIS transistors constituting the current mirror circuit and the amplifying circuit, and the absolute value of the threshold voltage of the second conductivity type enhancement MIS transistor having the first threshold voltage is higher than the absolute value of the threshold voltage of the second conductivity type enhancement MIS transistor having the second threshold voltage.

7. A voltage detecting circuit comprising:

a current mirror circuit having at least one input terminal and at least one output terminal;

a first constant current circuit with an output terminal connected to the input terminal of the current mirror circuit;

a first conductivity type enhancement MIS transistor having a gate electrode, a drain electrode, and a source electrode, the drain electrode being connected to the output terminal of the current mirror circuit, and the source electrode being connected to a first power supply potential;

a second constant current circuit with an output terminal connected to the gate electrode of the first conductivity type MIS transistor;

a second conductivity type enhancement MIS transistor having a first current drive capability and including a gate electrode, a drain electrode, and a source electrode, the drain electrode being connected to the output terminal of the second constant current circuit, the source electrode being connected to a second power supply potential, and the gate electrode being connected to the first power supply potential;

a second conductivity type enhancement MIS transistor having a second current drive capability and including a gate electrode, a drain electrode, and a source electrode, the drain electrode being connected to the output terminal of the second constant current circuit, and the source electrode being connected to the second power supply potential;

an inverter circuit including an output terminal and an input terminal, the output terminal being connected to the gate electrode of the second conductivity type enhancement MIS transistor having the second current drive capability; and an amplifying circuit including at least one input terminal and at least one output terminal, the input terminal being connected to the output terminal of the current mirror circuit, the output terminal being connected to an input of the inverter circuit, and the output terminal being a terminal for outputting a voltage detection output of the power supply potential, wherein a threshold voltage of the second conductivity type enhancement MIS transistor having the first current drive capability is equal to a threshold voltage of the second conductivity type MIS transistor having the second current drive capability.

8. A voltage detecting circuit according to claim 7, wherein the current mirror circuit includes a second conductivity type first MIS transistor and a second conductivity type second MIS transistor, a source electrode of the second conductivity type first MIS transistor is connected to the second power supply potential, a gate electrode and a drain electrode are connected in common and are connected to an input terminal of the current mirror circuit, a source electrode of the second conductivity type second MIS transistor is connected to the second power supply potential, a drain electrode is connected to the output terminal of the current mirror circuit, a gate electrode is connected to the gate electrode and the drain electrode of the second conductivity type first MIS transistor, the first constant current circuit includes a first conductivity type depletion MIS transistor, source electrode and a gate electrode of the first conductivity type depletion MIS transistor constituting the first constant current circuit is connected to the first power supply potential, a drain electrode is connected to the output terminal of the first constant current circuit, the second constant current circuit includes a first conductivity type depletion MIS transistor, a source electrode and a gate electrode of the first conductivity type depletion MIS transistor constituting the second constant current circuit are connected to the first power supply potential, a drain electrode is connected to the output terminal of the second constant current circuit, and the amplifying circuit is an inverter circuit including a first conductivity type enhancement MIS transistor and a second conductivity type enhancement MIS transistor.

* * * * *